US010840405B2

(12) United States Patent
Boieriu et al.

(10) Patent No.: US 10,840,405 B2
(45) Date of Patent: Nov. 17, 2020

(54) INDUCTIVELY COUPLED PLASMA FOR HYDROGENATION OF TYPE II SUPERLATTICES

(71) Applicants: Paul Boieriu, Lake Zurich, IL (US); Christoph H Grein, Wheaton, IL (US)

(72) Inventors: Paul Boieriu, Lake Zurich, IL (US); Christoph H Grein, Wheaton, IL (US)

(73) Assignee: Sivananthan Laboratories, Inc., Bolingbrook, IL (US)

( * ) Notice: Subject to any disclaimer, the term of this patent is extended or adjusted under 35 U.S.C. 154(b) by 0 days.

(21) Appl. No.: 15/799,990

(22) Filed: Oct. 31, 2017

(65) Prior Publication Data
US 2019/0131486 A1 May 2, 2019

(51) Int. Cl.
| H01L 21/322 | (2006.01) |
| H01L 31/18 | (2006.01) |
| H01L 31/0352 | (2006.01) |
| H01J 37/32 | (2006.01) |
| H01L 31/0304 | (2006.01) |

(52) U.S. Cl.
CPC ...... *H01L 31/1868* (2013.01); *H01J 37/3211* (2013.01); *H01J 37/32449* (2013.01); *H01J 37/32834* (2013.01); *H01L 31/035236* (2013.01); *H01J 37/32183* (2013.01); *H01J 37/32715* (2013.01); *H01L 31/0304* (2013.01); *H01L 31/03046* (2013.01)

(58) Field of Classification Search
CPC ............ H01J 37/3211; H01J 37/32449; H01J 37/32834; H01J 37/32183; H01J 37/32715; H01L 31/1868; H01L 31/035236; H01L 31/0304; H01L 31/03046
See application file for complete search history.

(56) References Cited

U.S. PATENT DOCUMENTS

| 7,888,251 | B2 | 2/2011 | Golding et al. |
| 8,039,051 | B2* | 10/2011 | Keevers .............. H01L 21/3003 427/248.1 |
| 2002/0016044 | A1* | 2/2002 | Dreybrodt ........... C23C 16/0272 438/305 |

(Continued)

OTHER PUBLICATIONS

Kimura, Takashi and Kasugai, Hiroki; Properties of Inductively Coupled rf Ar/H2 Plasmas: Experiment and Global Model; Apr. 29, 2010; pp. 2-10; 107; Journal of Applied Physics; Nagoya, Japan.

(Continued)

*Primary Examiner* — Calvin Y Choi
(74) *Attorney, Agent, or Firm* — Erickson Law Group, PC

(57) ABSTRACT

A process and apparatus is provided to generate and introduce hydrogen from an inductively coupled plasma system into a type II superlattice wafer. The type II superlattice wafer can contain a number of detectors formed on one of its faces. The process can use hydrogen plasma with a total chamber pressure of 20-300 mTorr, a hydrogen gas flow of 50-100 sccm, an ICP power of 100-900 W, a secondary RF power of 15-90 W, and a process duration adjusted to maximize the benefit of hydrogenation (typically between several tens and several hundreds of seconds). The process can introduce a secondary gas to facilitate the plasma ignition, hydrogen ionization and recombination processes or hydrogen diffusion and impingement onto the type II superlattice wafer.

18 Claims, 1 Drawing Sheet

(56) References Cited

U.S. PATENT DOCUMENTS

| | | | |
|---|---|---|---|
| 2004/0142504 A1* | 7/2004 | Razeghi | 438/93 |
| 2011/0104902 A1* | 5/2011 | Yamazawa | H01J 37/321 |
| | | | 438/710 |
| 2011/0140076 A1* | 6/2011 | Song | H01L 33/0079 |
| | | | 257/13 |
| 2013/0302980 A1* | 11/2013 | Chandrashekar | ............ |
| | | | H01L 21/76877 |
| | | | 438/666 |
| 2016/0172411 A1* | 6/2016 | Tsuji | H01L 27/14643 |
| | | | 257/21 |
| 2017/0194135 A1* | 7/2017 | Nakayama | H01L 21/0234 |

OTHER PUBLICATIONS

Canedy, C.L., Aifer, E.H., Warner, J.H., Vurgaftmani., Jackson, E.M., Tischler, J.G., Powell, S.P., Olver, K., Meyer, J.R., Tennant, W.E.;Controlling Dark Current in Type-II Superlattice Photodiodes; Infrared Physics & Technology; Sep. 29, 2009; pp. 1-9; 52; Elsevier, B.V.

Plis, A. Elena; InAs/GaSb Type-II Superlattice Detectors; Advances in Electronics; Apr. 10, 2014; pp. 1-13; vol. 2014; Hindawi Publishing Corporation; Alburquerque, NM.

Stoltz, A.J., Benson, J.D., and Smith, P.J.; Plasma Passivation Etching for HgCdTe; Journal of Electronic Materials; Jun. 2, 2009; pp. 1741-1745; vol. 38, No. 8, 2009; Ft. Belvoir, VA.

White, J.K., Musca, C.A., Lee, H.C., and Faraone, L.; Hydrogenation of ZnS passivation on narrow-band gap HgCdTe; Applied Physics Letters; Apr. 24, 2000; pp. 1-4; vol. 76, No. 17; American Institute of Physics.

Flatte, E. Michael and Pryor, E. Craig; Defect States in Type-II Strained-layer Superlattices; Invited Paper; Sep. 11, 2011; pp. 1-9; vol. 7608; Department of Physics and Astronomy and Optical Science and Technology Center, University of Iowa; Iowa City, Iowa.

Kim, Young-Ho, Bae, Soo-Ho, Lee, Hee Chul, Kim, Choong-Ki; Surface Leakage Current Analysis of Ion Implanted ZnS—Passivated n-on-p. HgCdTe Diodes in Weak Inversion; Journal of Electronic Materials,pp. 1-5; vol. 29, No. 6, 2000; Korea Advanced Institute of Science and Technology, Department of Electrical Engineering, and Center for Electro-Optics; Korea.

Boieriu, Paul, Velicu, S., Bommena, R., Buurma, C., Blisset,C., Grein, C., Sivananthan, S., Hagler, P.; High Operation Temperature of HgCdTe Photodiodes by Bulk Defect Passivation; Invited Paper; Feb. 20, 2013; pp. 1-20; vol. 8631; Missile Defense Agency, Redstone Arsenal, AL.

* cited by examiner

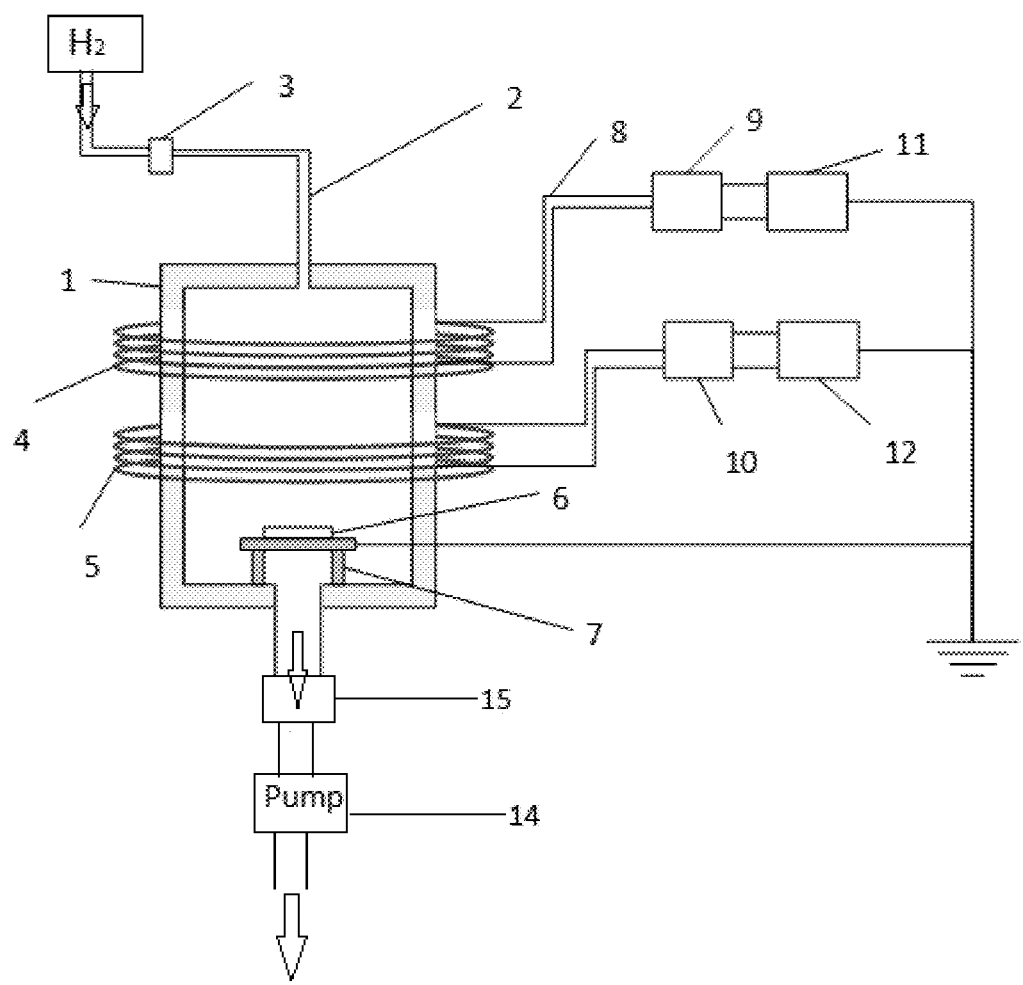

INDUCTIVELY COUPLED PLASMA FOR HYDROGENATION OF TYPE II SUPERLATTICES

STATEMENT REGARDING FEDERALLY SPONSORED RESEARCH OR DEVELOPMENT

This invention was made with government support under Order NNX16CP72P awarded by NASA. The government has certain rights in the invention.

BACKGROUND OF THE INVENTION

Even when grown under lattice-matched conditions, extended and point native defects of various types, including dislocations, vacancies, antisites and interstitials, can be present in any epitaxially grown semiconductor. Defects intersecting the electrical junction may contribute to shunt, tunneling and generation-recombination dark current components, increasing the noise, and subsequently decreasing the detectivity of photodiodes. Defects in the absorber increase diffusion-limited dark currents with commensurate detectivity drops. Defects and their random distribution generate spatial noise and limit photogenerated current collection in focal plane arrays (FPAs).

Current studies indicate that fast Shockley-Read-Hall (SRH) generation/recombination dominates the carrier lifetime of type II superlattices (T2SL). The SRH rate depends on the concentration and capture cross sections of these defects, and on the position of their energy states within the T2SL band gap. The passivation of some of these defects can be achieved through the introduction of an impurity atomic species that, for example, passivate dangling bonds. Hydrogen has been most extensively utilized for such purposes. The attachment of hydrogen to the dangling bond forms bonding and antibonding states whose separation exceeds the narrow band gap of the T2SL. The bonding states are in the valence band and no longer electrically active while the unoccupied antibonding states are in the conduction band and are likewise electrically inactive. Reducing the electrical activity of defects by passivating them with hydrogen is equivalent to lowering their density, thereby allowing for improved accuracy of detection/discrimination when an FPA is employed under typical operating conditions, or providing similar performance with the FPA operating under less stringent conditions (such as higher system temperature, increased system jitter, damaged read out integrated circuit (ROIC) wells).

The hydrogen passivation of both shallow and deep levels has been well-studied in many major semiconductors, particularly Si and GaAs. Perhaps its most prominent application is in hydrogenated amorphous silicon (a-Si:H) solar cells. Notably, it has been found to significantly reduce leakage currents through dislocation cores in GaN. Atomic hydrogen has been found to passivate shallow donors and acceptors in virtually all semiconductors. Extensive theoretical and experimental studies have elucidated the microscopic mechanisms of shallow level passivation in many cases.

Deep level passivation has been found to be more thermally stable than shallow level passivation. Even so, the thermal stability has generally not been found to be so great as to make hydrogen passivation a major tool in the fabrication of high performance semiconductor-based devices. The exact mechanisms by which hydrogen passivates deep levels are poorly understood, in part due to the lack of a clear understanding of the microscopic nature of many deep levels.

Early research on the passivation of FPAs and IR-sensitive materials employed electrochemical methods to introduce hydrogen into $Hg_{0.5}Cd_{0.5}Te$. Other investigation on Mercury vacancy-doped HgCdTe reached the conclusion that electron cyclotron resonance (ECR) plasma hydrogenation is effective in passivating surface trap states. Still further research concluded that hydrogen's only role is to passivate mercury vacancies. Some studies found that hydrogenation improves the quality of HgCdTe/passivant interfaces. Improvements in key electrical parameters of HgCdTe epilayers (Hall mobility and minority carrier lifetime) suggest that the incorporated hydrogen passivated both scattering and recombination centers.

Other groups have used UV light to generate atomic hydrogen or deuterium, depending on the process gas used, which is a "photon-assisted hydrogenation" approach. The same group reports that hydrogen passivation was found to be selective to deep levels associated with defects rather than shallow impurity levels, thus deactivating defects without adversely affecting device functionality, as confirmed by the reduction of dark currents and improved quantum efficiency.

However, the intake of hydrogen was found to depend strongly on the spectral content of the UV source lamp and the process temperature. A minimum of 60° C. was reported necessary to incorporate detectable deuterium when using Hg or Xe lamps. Photodiodes exposed to UV illumination from a high-pressure mercury lamp exhibited degradation in their performance caused by the light or radiation absorbed in the ZnS layer. These findings were later confirmed by an anomalous degradation in HgCdTe diodes when exposed to hydrogen and UV radiation simultaneously.

The present inventors have recognized that the need for heat sources in the presence of hydrogen gas, the strong dependence on the type of UV source, as well as the presence of high energy electrons generated after UV absorption in HgCdTe reduce the likelihood of this technique becoming a wide-spread industry preference.

ICP is widely used when a low-temperature, dense and uniform plasma is needed. Widespread use of ICPs in industry began at the end of the 1980s after the successful study and commercialization of the helicon discharge. Because of their high ionization efficiency, the plasma densities achieved in the helicon discharge are almost one order of magnitude higher than in other discharges for comparable gas pressures and input powers. ICP discharges are widely used today in numerous technological processes because of their high charged particle densities and their low power losses in the sheaths.

The inductive power coupling mechanism does not generate a large voltage across the RF sheath, and therefore reduces the interaction of the ions with chamber walls. Compared to a capacitively-coupled plasma, ICP reduces chemical reactions on the wall surface, sputtering, and etching. Plasma-assisted thin-film deposition, etching, surface cleaning, oxidation, and hardening play a crucial role in the semiconductor industry. ICPs have become the high-density plasmas of choice for processing FPAs.

SUMMARY

The exemplary embodiments of the process and apparatus of the invention uses inductively coupled hydrogen plasmas to generate and incorporate hydrogen into semiconductor workpieces, such as type II superlattices. The exemplary embodiments of the process and apparatus of the invention will generate desirable improvements of type II superlattice material and devices, such as increased carrier mobility, increased carrier lifetime, and reduced dark current.

The use of two combined radio-frequency plasma discharges, as well as the respective plasma parameters, may provide for bulk passivation of semiconductors with hydrogen for its potential to become a tool for the fabrication of high performance devices due to its potential to passivate some of the electrically active defects.

The exemplary embodiment process and apparatus of the invention uses hydrogen plasmas with a suitable set of parameters and a combination of two plasmas to control the direct-current (DC) biasing between the plasma and a grounded chuck hosting the T2SL semiconductor wafer or device, thus controlling the rate of arrival of various hydrogen species created within the ICP plasma. Preferably the hydrogen plasmas are hydrogen-only plasmas.

Long carrier lifetimes and good mobilities are key to achieving high quantum efficiencies and detectivities.

The exemplary passivation method has the potential to not only remove the deleterious effects of bulk material defects, but also improve surface passivation. This is important because as the detector (pixel) size is reduced, the device's surface area to volume ratio increases and surface leakage current mechanisms become more significant and hence need to be carefully considered and addressed. This is especially true for the long-wavelength infrared (LWIR) and very long-wavelength infrared (VLWIR) detectors, with cutoffs extending beyond 14 □m.

Different ICP recipes using other parameters may not produce the desired outcome of the present exemplary process of the invention (simultaneous increased carrier lifetimes, increased carrier mobility and reduces dark current). For example, process gases using hydrogen mixtures (Ar/H$_2$) are already in use in Oxford or Aviza inductively-coupled plasma systems.

The exemplary method of generating and incorporating hydrogen into T2SL is suitable for large area FPAs and easily scalable to simultaneously treat multiple FPAs if needed to accommodate high production throughput.

The exemplary method of the invention provides a process to generate and introduce hydrogen from the inductively coupled plasma system, into a type II superlattice wafer. The type II superlattice wafer can contain a number of detectors formed on one of its faces. These detectors may be fully fabricated or at various stages in their forming process. The process can use hydrogen plasma with a total chamber pressure of 20-300 mTorr, a hydrogen gas flow of 50-100 sccm, an ICP power of 100-900 W, a secondary RF power of 15-90 W, and a process duration adjusted to maximize the benefit of hydrogenation (typically between several tens and several hundreds of seconds). The process can introduce a secondary gas, besides hydrogen, whether simultaneously, or in alternating time intervals, to facilitate the plasma ignition, hydrogen ionization and recombination processes or hydrogen diffusion and impingement onto the processed wafer. The electrostatic chuck can be temperature controlled. The process can provide that He gas is flowed onto the backside of the wafer placed onto the electrostatic chuck to create a gas cushion that improves the thermal contact between the temperature-controlled chuck and the processed wafer.

Numerous other advantages and features of the present invention will be become readily apparent from the following detailed description of the invention and the embodiments thereof, and from the accompanying drawings.

BRIEF DESCRIPTION OF THE DRAWING

The FIGURE is a schematic diagram of an Inductively Coupled Plasma (ICP) system in accordance with one embodiment of the present invention.

DETAILED DESCRIPTION

While this invention is susceptible of embodiment in many different forms, there are shown in the drawings, and will be described herein in detail, specific embodiments thereof with the understanding that the present disclosure is to be considered as an exemplification of the principles of the invention and is not intended to limit the invention to the specific embodiments illustrated.

The hydrogen passivation of defects in T2SL wafers, fully fabricated photodiodes and FPAs is performed using an ICP system operating at 13.56 MHz. An ICP process using only hydrogen gas (H$_2$) has proven effective in generating the hydrogen passivant, maintaining the T2SL surface morphology and avoiding cross-contamination. ICP ensures a high plasma density, conferring a high density of atomic hydrogen at low operating pressures. The hydrogen species generated within the plasmas act as passivants. The plasma exposure typically takes place while the sample resides on a grounded electrode.

Total chamber pressure, H$_2$ gas flow, and ICP power are important plasma parameters, individually controlled. An automatic radio-frequency (RF) matching unit is used to tune the plasma to the RF power supply for an effective energy transfer. A secondary high-frequency voltage is used to generate an additional plasma discharge. The interplay of the two discharges controls the DC biasing with respect to the grounded electrode holding the sample. Both the ICP and the RF generators run at 13.56 MHz with a phase shift between them to prevent interference. Inductively-coupled hydrogen plasmas at 13.56 MHz operate in a regime in which the electron plasma frequency is commensurate with the exciting-field frequency ω, which exceeds the ion plasma frequency even for ion densities of the order of $n_i=10^{10}$ cm$^{-3}$, thus the ion positions within the plasma vary only slightly over time.

All thermal H$_2^+$ ions are almost instantaneously converted into H$_3^+$ due to the very efficient exothermic reaction: H$_2^+$+H$_2$→H$_3^+$+H+1.71 eV. The dominant hydrogen-ion species present in the plasma is H$_3^+$. Irrespective of the hydrogen pressure, H$_3^+$ is the major ion species in the plasma and the rate at which H$_3^+$ is produced is nearly independent of temperature. In this mechanism, the H$_2^+$ initially produced through electron impact is largely converted into H$_3^+$ even at low pressures. Since H$_3^+$ interacts inefficiently with the H$_2$ molecules, most of the H$_3^+$ ions that cross the sheath region do so without significant energy changes. Other ion species have been reported to have densities one to two orders of magnitude lower than H$_3^+$, and while passing through the plasma sheath their energy distribution broadens as a result of collisional interactions.

The atomic hydrogen is expected to diffuse outside the plasma boundary since it is not influenced by the electric field and reach the T2SL samples placed on the electrostatic chuck. In the case of H$_2$-only plasmas, the main loss mechanism of the dominant ion species, H$_3^+$, is the flux to the wall and the subsequent production of H and H$_2$. The RF generator is used to control the DC bias to prevent the ionized hydrogen species ($H_3^+$, $H_2^+$ or $H^+$) from reaching the samples. Hydrogen reaching the sample will diffuse rapidly in search of dangling bonds surrounding material defects, to which it will immediately bond.

In accordance with one exemplary embodiment of the apparatus to practice the invention, an ICP vacuum chamber 1 is connected to a pumping system that allows for high- to ultra-high vacuum ($<10^{-5}$-$10^{-6}$ Torr) levels to be achieved. This is desired in order to avoid contamination of the T2SL wafers or devices. Hydrogen gas of high purity (99.995% or better) is introduced using gas lines 2 through a mass flow controller 3. The ICP vacuum chamber is flow connected to a pump 14 through a throttling gate valve 15 which, in tandem with the mass flow controller 3, will be used to achieve the desired process chamber pressure and gas flow. Two coils placed either inside or outside the ICP chamber provide for the high-frequency electromagnetic field necessary to generate the plasmas. A primary ICP plasma is created by a coil 4 and a secondary plasma is generated by a coil 5 in the vicinity of an electrostatic chuck 7 that supports a processed wafer 6. The coils 4 and 5 are electrically connected through appropriate cabling 8 to radio-frequency matching units 9 and 10 and to respective power supplies 11 and 12.

The exhaust would be mostly hydrogen gas (neutral hydrogen molecules) following the rapid recombination of hydrogen ions after exiting the plasma. Secondary gases may be introduced through the same inlet as the hydrogen, or through different inlet(s), after being passed through similar, yet distinct, mass flow controllers.

The exemplary method of the invention provides a process to generate and introduce hydrogen from the inductively coupled plasma system described herein, into a type II superlattice wafer. The type II superlattice wafer can contain a number of detectors formed on one of its faces. The process can use hydrogen plasma with a total chamber pressure of 20-300 mTorr, a hydrogen gas flow of 50-100 sccm, an ICP power of 100-900 W, a secondary RF power of 15-90 W, and a process duration adjusted to maximize the benefit of hydrogenation (typically between several tens and several hundreds of seconds). The process can introduce a secondary gas, besides hydrogen, whether simultaneously, or in alternating time intervals, to facilitate the plasma ignition, hydrogen ionization and recombination processes or hydrogen diffusion and impingement onto the processed wafer. The electrostatic chuck can be temperature controlled. The process can provide that He gas is flowed onto the backside of the wafer placed onto the electrostatic chuck to create a gas cushion that improves the thermal contact between the temperature-controlled chuck and the processed wafer.

From the foregoing, it will be observed that numerous variations and modifications may be effected without departing from the spirit and scope of the invention. It is to be understood that no limitation with respect to the specific apparatus illustrated herein is intended or should be inferred.

The invention claimed is:

1. A process of bulk passivating a superlattice wafer for a light-receiving focal plane array, comprising the steps of:
providing an inductively coupled plasma system including a chamber and a primary plasma coil and a secondary plasma coil;
holding a superlattice wafer inside the chamber;
introducing hydrogen into the chamber;
maintaining a primary plasma coil power at a greater level than a secondary coil power;
wherein the plasma created is substantially a hydrogen-only plasma.

2. The process according to claim 1, comprising the further step that a secondary gas is introduced into the chamber, different than hydrogen, to facilitate the plasma ignition, hydrogen ionization and recombination processes or hydrogen diffusion and impingement onto the superlattice wafer.

3. The process according to claim 2, wherein the step of holding a superlattice wafer inside the chamber is further defined in that an electrostatic chuck is arranged inside the chamber and the superlattice wafer is held inside the chamber by the electrostatic chuck and the electrostatic chuck is temperature controlled.

4. The process according to claim 3, comprising the further step that He gas is flowed onto the backside of the superlattice wafer placed onto the electrostatic chuck to create a gas cushion that improves the thermal contact between the temperature-controlled chuck and the superlattice wafer.

5. The process according to claim 1, wherein the step of holding a superlattice wafer inside the chamber is further defined in that an electrostatic chuck is arranged inside the chamber and the superlattice wafer is held inside the chamber by the electrostatic chuck and the electrostatic chuck is temperature controlled.

6. The process according to claim 5, comprising the further step that He gas is flowed onto the backside of the superlattice wafer placed onto the electrostatic chuck to create a gas cushion that improves the thermal contact between the temperature-controlled chuck and the superlattice wafer.

7. The process according to claim 6, wherein the step of introducing hydrogen into the chamber is further defined in that the hydrogen is substantially pure hydrogen.

8. The process according to claim 1, wherein the step of introducing hydrogen into the chamber is further defined in that the hydrogen is substantially pure hydrogen.

9. The process according to claim 1, wherein:
the step of introducing hydrogen into the chamber is further defined by the steps of maintaining a total chamber pressure of 20-300 mTorr, and a hydrogen gas flow of 50-100 sccm; and
the step of maintaining a primary plasma coil power at a greater level than a secondary coil power is further defined in that the primary plasma coil power is between 100-900 W, and the secondary plasma coil power is between 15-90 W.

10. The process according to claim 9, wherein the step of providing an inductively coupled plasma system including a chamber and a primary plasma coil and a secondary plasma coil is further defined in that as between the primary and secondary plasma coils, the secondary plasma coil is arranged closer to the superlattice wafer held inside the chamber.

11. The process according to claim 9, wherein the step of holding a superlattice wafer inside the chamber is further defined in that an electrostatic chuck is provided in the chamber and the superlattice wafer is held on the electrostatic chuck.

12. A process of bulk passivating superlattice wafer for a light-receiving focal plane array, comprising the steps of:
providing an inductively coupled plasma system including a chamber and at least one plasma coil;
holding a superlattice wafer inside the chamber;
introducing hydrogen into the chamber;

maintaining a primary plasma coil power to generate a substantially hydrogen-only plasma.

13. The process according to claim 12, comprising the further step that a secondary gas is introduced into the chamber, different than hydrogen, to facilitate the plasma ignition, hydrogen ionization and recombination processes or hydrogen diffusion and impingement onto the superlattice wafer.

14. The process according to claim 12, wherein the step of holding a superlattice wafer inside the chamber is further defined in that an electrostatic chuck is arranged inside the chamber and the superlattice wafer is held inside the chamber by the electrostatic chuck and the electrostatic chuck is temperature controlled.

15. The process according to claim 12, wherein the step of introducing hydrogen into the chamber is further defined in that the hydrogen is substantially pure hydrogen.

16. The process according to claim 12, wherein:
the step of introducing hydrogen into the chamber is further defined by the steps of maintaining a total chamber pressure of 20-300 mTorr, and a hydrogen gas flow of 50-100 sccm; and
the step of maintaining a plasma coil power is further defined in that the plasma coil power is between 100-900 W.

17. The process according to claim 12, wherein the superlattice wafer is a type II superlattice wafer.

18. The process according to claim 1, wherein the superlattice wafer is a type II superlattice wafer.

* * * * *